United States Patent [19]
Haire et al.

[11] Patent Number: 5,285,074
[45] Date of Patent: Feb. 8, 1994

[54] DYNAMIC COMPENSATION OF NON-LINEAR ELECTRON BEAM LANDING ANGLE IN VARIABLE AXIS LENSES

[75] Inventors: Don F. Haire, Verbank; Cecil T. Ho, Poughkeepsie; Guenther O. Langner, Glen, all of N.Y.; Werner Stickel, Ridgefield, Conn.; Edward V. Weber, Poughkeepsie, N.Y.

[73] Assignee: International Business Machines Corporation, Armonk, N.Y.

[21] Appl. No.: 893,172

[22] Filed: Jun. 3, 1992

[51] Int. Cl.⁵ .......................................... H01J 37/147
[52] U.S. Cl. .......................... 250/396 R; 250/396 ML
[58] Field of Search ........... 250/396 R, 396 ML, 398, 250/492.2

[56] References Cited
U.S. PATENT DOCUMENTS

| | | | |
|---|---|---|---|
| 4,362,942 | 12/1982 | Yasuda | 250/398 |
| 4,544,846 | 10/1985 | Langner et al. | 250/396 ML |
| 4,728,797 | 3/1988 | Gotou et al. | 250/492.22 |
| 4,789,945 | 12/1988 | Niijima | 250/398 |
| 4,859,856 | 8/1989 | Groves et al. | 250/396 ML |
| 5,047,647 | 9/1991 | Itoh et al. | 250/398 |
| 5,148,033 | 9/1992 | Yamada et al. | 250/398 |

*Primary Examiner*—Bruce C. Anderson
*Attorney, Agent, or Firm*—Whitham & Marhoefer

[57] ABSTRACT

A dynamic correction arrangement for an electron beam projection/deflection system provides high order correction values for deflection in accordance with a correction equation. Particularly as applied to high accuracy telecentric deflection, the coefficients of terms of the correction equation may be determined by calibration for a small number of test points. Correction values may be stored in a look-up table or computed in real time by using a math co-processor in a processing pipeline. The correction provided corrects landing angle errors through the third order in telecentric projection/deflection systems such as systems utilizing variable axis immersion lenses.

17 Claims, 3 Drawing Sheets

DYNAMIC COMPENSATION OF NON-LINEAR ELECTRON BEAM LANDING ANGLE IN VARIABLE AXIS LENSES

DESCRIPTION

BACKGROUND OF THE INVENTION

1. Field of the Invention

The present invention generally relates to high precision electron beam projection/deflection systems and, more particularly, to electron beam projection/deflection systems including at least one variable axis lens.

2. Description of the Prior Art

Electron beam projection/deflection systems are used in many types of devices such as cathode ray tubes used for display, as in televisions, oscilloscopes and computer displays. Electron beam projection/deflection systems are also used in electron beam lithography systems, particularly for exposure of resists in the fabrication of masks for use in fabrication of integrated circuits and also direct writing for patterning of resists directly placed on substrates and other structures. As integrated circuit density has increased and pattern feature size correspondingly reduced, exposure of resists using an electron beam exposure system, sometimes referred to as an e-beam tool, in which an electron beam can be deflected over a surface with high speed and accuracy under computer control, has become highly advantageous and the exposure methodology of choice.

Electron beam projection/deflection systems (hereinafter also referred to simply as deflection systems) are typically pivotal. That is, the beam trajectory is deflected around a pivot point on the electron-optical axis of the system at a finite distance from the target. There are two major consequences of this property of electron beam projection/deflection systems. First, for a substantial portion of the travel of electrons through the electron beam projection/deflection system, the electrons are separated from the electron-optical axis and are therefore subject to "off-axis electron-optical aberrations which degrades the performance of the electron beam projection/deflection system. Second, the direction from which the electron beam impinges on the target plane through the electron beam projection/deflection system (e.g. the plane of the surface of a substrate or specimen) varies with the impact position in the field which can be written by the deflected beam. Therefore, any axial displacement of the target surface, due, for example, to variation in thickness of a substrate or tilt of its plane relative to a plane normal to the electron-optical axis of the system, translates into an undesirable lateral displacement of the beam. Compensation of this lateral displacement generally requires complicated special measures to obtain electron beam exposure at the desired location.

However, the above-described deficiencies are largely eliminated in advanced projection/deflection systems employing the Variable Axis Immersion Lens (VAIL) concept. U.S. Pat. Nos. 4,544,846 to Langner et al and 4,859,856 to Groves et al, both assigned to the assignee of the present application are exemplary of the VAIL system and are hereby fully incorporated by reference herein.

Ideally, the VAIL system provides telecentric imaging as well as positioning of the electron beam within the exposure field of a lithography system. The term "telecentric" here means that at any location in the field the electrons in the beam appear to originate from an object on the optical axis infinitely remote from the target. This is accomplished by a collimator lens, which collimates the beam prior to deflection through complementary angles by a magnetic double-deflection device, and by altering the optical axis of the projection lens relative to the mechanical axis of the electron beam column to coincide with the location of the collimated beam. The latter is accomplished by superpositioning the magnetic field of an additional deflection device over the lens field. In practice, this arrangement seeks to maintain an angle of incidence on the target normal to the target plane.

However, it has been established that the VAIL system in its present implementation performs this function accurately only to a first-order approximation. Higher (mainly third) order effects lead to a landing angle variation and position distortion over the field of exposure large enough to be of concern for lithography of ever decreasing pattern feature dimensions for higher degrees of integration density of integrated circuits.

At higher component densities in integrated circuits, the tolerance for positional error in exposure by the electron beam becomes very much reduced. For pattern design rules having a particular minimum feature size, often referred to as a regime, the tolerance for errors of position and distortion of the electron beam is usually more than an order of magnitude smaller. These errors can originate from several sources and the total cumulative allowable error is commonly referred to as an error budget. For example, in a regime having a minimum feature size of a substantial fraction (e.g. about one-quarter) of a micron, the total error budget is on the order of a few tens of nanometers.

Keeping the shape and positioning of the electron beam deflection within this error budget is difficult. For example, in the VAIL system, the aforementioned third-order landing angle variation over a 10 mm deflection field amounts to a significant fraction of a degree. This can lead to positional errors of more than 100 nm, far more than is tolerable even for the 0.5 $\mu$m regime. (Note that the angle variation of a pivotal (i.e. non-telecentric) projection/deflection system is more than an order of magnitude larger). Therefore, even with the superior performance of the Variable Axis Lens projection/deflection system the errors due to higher order variation from ideal telecentric performance are not acceptable for advanced semiconductor microfabrication.

Furthermore, the higher order angle and distortion aberrations of VAIL vary, by definition, not only non-linearly over the field, but also anisotropically (i.e. varying in both their radial and azimuthal components). Correction of these aberrations by design of the electron optics is not possible. Dynamic correction (i.e. beam position correction point by point) in the deflection field, based on a calibration procedure, is presently practiced. Dynamic correction, however, is excessively demanding as well as inadequate in its accuracy, particularly for the sub-half micron regime due to the need to obtain empirical correction data during calibration for a great number of points in order to approach the complexity of the aberrations.

SUMMARY OF THE INVENTION

It is therefore an object of the present invention to provide a high order correction for variable axis lens projection/deflection systems.

It is another object of the invention to provide a method and apparatus for controlling an electron beam projection/deflection system which is corrected for high order deviations from telecentricity in regard to a variable axis projection lens.

It is a further object of the invention to provide a computational procedure to derive correction coefficients for high order landing angle variation errors in an electron beam projection/deflection system.

It is another further object of the invention to provide for dynamic correction of deviations from telecentricity of a projection/deflection system based on a small number of calibration points.

In order to accomplish these and other objects of the invention, a method is provided for correcting deviations from telecentric deflection in an electron beam projection/deflection system comprising the steps of establishing values for coefficients A, B and C in the equation:

$$\Delta I_{x,y} = (I_x^2 + I_y^2)[Ax(I_y - I_x) - (I_x^2 + I_y^2)(BI_{x,y} + CI_{y,x})],$$

determining correction values for deflection currents corresponding to an address based on said further address, deflection currents corresponding to said address and said values of A, B and C, and correcting said deflection currents by the amount of said correction current values.

In accordance with another aspect of the invention, an electron beam projection/deflection system is provided including a deflection means and a dynamic correction means, wherein the dynamic correction means includes means responsive to an address, at least one deflection current corresponding to said address and coefficients of terms of a correction equation for providing a correction value, means for correcting said at least one deflection current in accordance with said correction value to obtain at least one corrected deflection current and means for applying said at least one corrected deflection current to said deflection means.

In accordance with a further aspect of the invention, an electron beam projection/deflection system including a deflection means for deflecting said electron beam in response to at least one deflection current applied thereto, a means for developing said at least one deflection current in response to an address, a means for providing correction values in response to said address, said correction values being approximately defined by a solution of the equation $$\Delta I_{x,y} = (I_x^2 + I_y^2)[Ax(I_y - I_x) - (I_x^2 + I_y^2)(BI_{x,y} + CI_{y,x})],$$

means for correcting said at least one deflection current in accordance with said correction value to derive a corrected deflection current, and means for applying said corrected deflection current to said deflection means.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
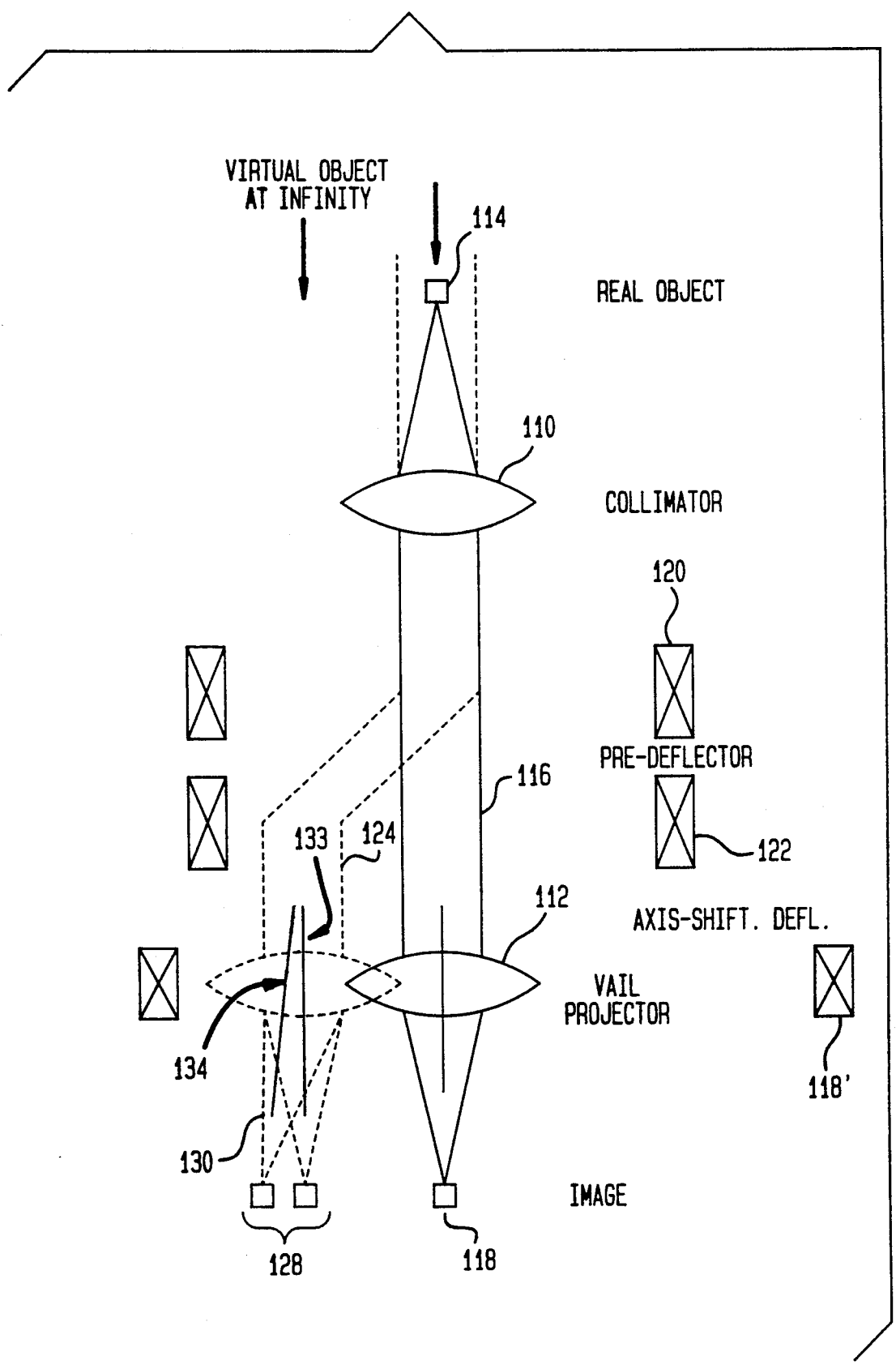
FIG. 1 is a schematic illustration of a telecentric projection/deflection arrangement including a variable axis projection lens.

Referring now to the drawings, and more particularly to FIG. 1, there is shown, in schematic form, the general arrangement 100 for telecentric deflection of an electron beam. The components of such a telecentric projection/deflection system are the collimator 110 and projection lens 112, the pre-deflector system 120 and 122 and the axis-shifting deflector 118'. The collimator provides parallel electron trajectories, entering the pre-deflector system and eventually the projector, as shown by the solid lines 116. The effect is that the real object 114 appears to be located at infinity. Its image 118 is formed accordingly in the back-focal plane of the projector.

Deflection is done with a pair of complementary deflectors 120 and 122. Ideally, deflector 120 deflects the beam through a predetermined angle in accordance with a desired beam incidence position on the target. Deflector 122 then ideally deflects the beam through a complementary angle to return the beam to a telecentric trajectory, as shown by dashed lines 124. As indicated above, however, this performance is accurate only to a first order approximation. In practice, due to the higher order errors, complete coincidence of the electron beam 124, displaced by the pre-deflector system 120/122, and the optical axis of the projector 133/134, shifted by the axis-shifting deflector 118', cannot be achieved simultaneously for all points in the deflection field. As indicated by the dotted lines 130, this leads to a deviation from telecentricity, i.e. to a variation of the beam landing angle and a corresponding positional aberration of the image points 128.

Figure 2:
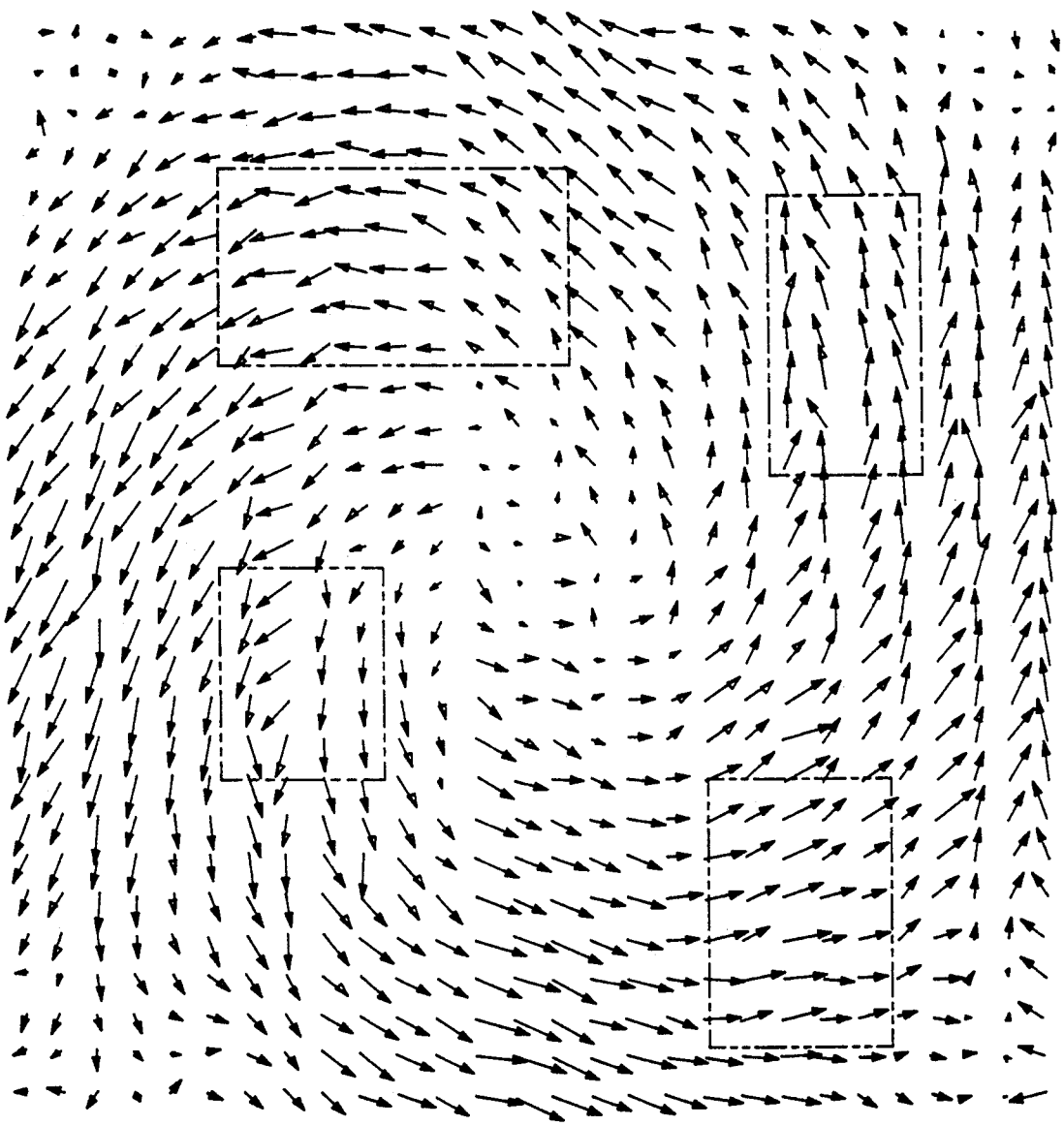
FIG. 2 is a demonstration of the positional errors introduced by target height variation produced by the system of FIG. 1 when uncorrected by the present invention.

The loss of telecentricity due to higher order aberrations is best demonstrated by the effect on beam position within the deflection field of a target height shift. The arrows in FIG. 2 show the displacement between corresponding points in the field measured at two different target positions 150 μm apart in the axial direction. As can be seen, the length and orientation of the arrows vary with the location in the field. Note that in the computer analysis the two fields have been aligned at the four corners.

With the error vectors changing size and direction from point to point (compare the various areas bounded by rectangles in the figure) a complicated, computationally intensive scheme of point-by-point correction would be required to compensate for the errors. Any such scheme would be erroneous by itself and therefore deficient.

However, the inventors herein have discovered that computer simulation carried out to the third order aberration effects shows that a set of coefficients exists which uniquely determines the magnitudes of correction signals for both x and y orthogonal deflection directions. The correction currents to be applied to the pre-deflector system 120/122 to force telecentricity to third-order obey the following equation:

$$\Delta I_{x,y} = (I_x^2 + I_y^2)[Ax(I_y - I_x) - (I_x^2 + I_y^2)(BI_{x,y} + CI_{y,x})],$$

The above equation consists entirely of sums of current values, corresponding to addresses, and the squares of those current values, multiplied by coefficients thereof. Therefore, the correction values in the x and y directions can be computed, in principle, from a relatively few data points during a calibration procedure to provide correction values for a very large number of points within the field of view of the electron beam deflection system in order to carry out dynamic correction. Applying deflector-drive currents following the above equation effectively "linearizes" the deflection regarding the landing angles and corresponding displacements. The coefficients are determined from a data array such as is depicted in FIG. 2 by a standard mathematical fitting procedure, such as the well-known "least squares" method, of all or a few data points with the analog function of the polynomial form given above. The positional data are derived by scanning the beam across reference grids, formed of a pattern (e.g. crossing bars) of a heavy metal (e.g. gold) embedded in a light material (e.g. silicon) mounted next to each other in the system at slightly different axial positions or heights. The location of the bars, relative to each other, is known though a separate, external, off-line calibration.

Figure 3:
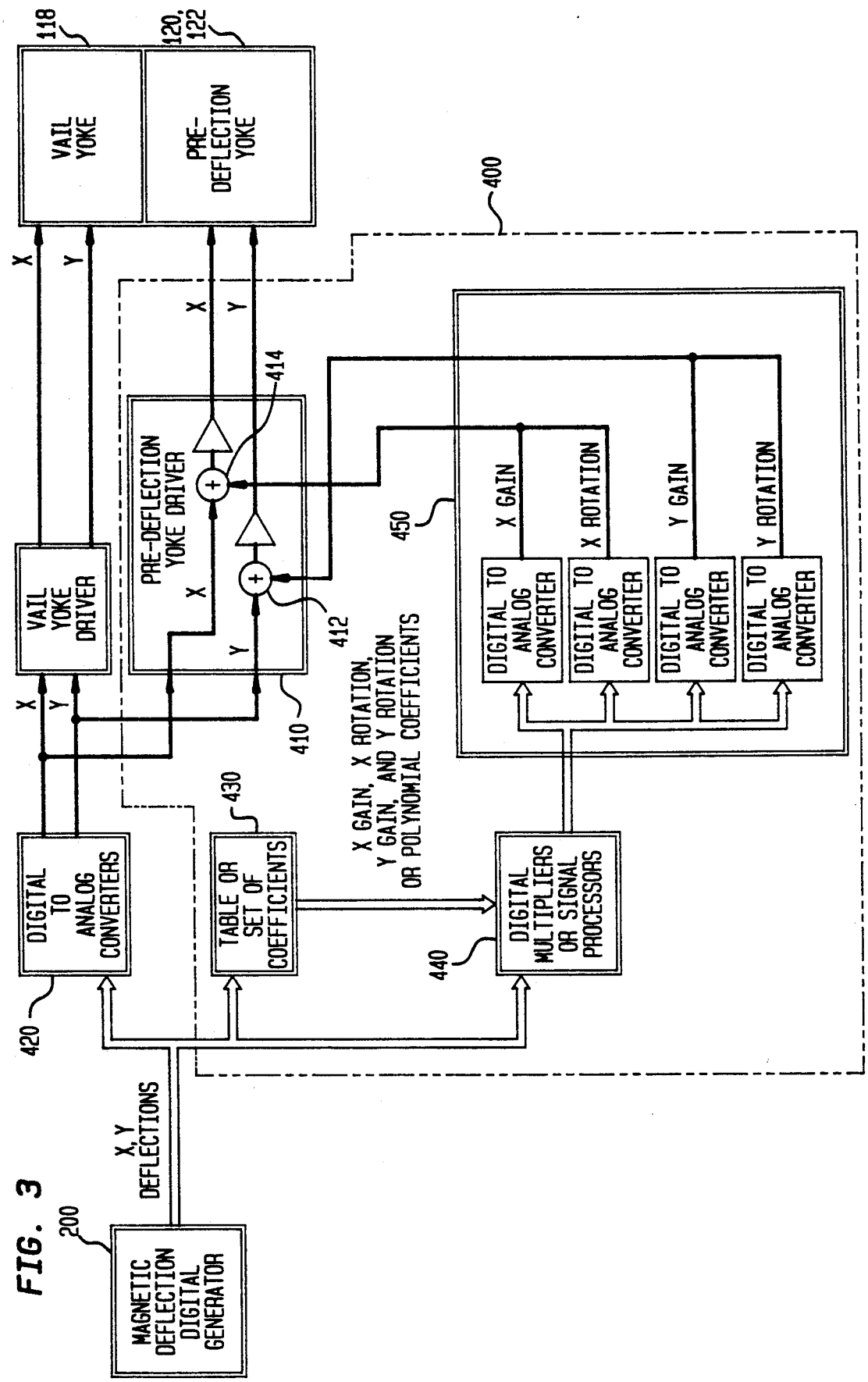
FIG. 3 is a schematic diagram of an implementation of the correction arrangement in accordance with the present invention.

Referring now to FIG. 3, an implementation of the invention will now be discussed. Some elements of FIG. 3, such as pre-deflection and axis shift (e.g. VAIL) yokes 118', 120, 122, yoke driver 119, and deflection digital address generator 200 are common to existing systems and need not be discussed further. The additional structure according to the invention is enclosed within dashed line 400.

Preferably, to improve the performance of the variable axis lens, the above polynomial equation is applied to make high order correction of the ideally complementary deflections provided by deflectors 120 and 122. This is done by applying the correction at mixers 412 and 414 of predeflection yoke drivers 410.

In order to obtain such correction signals, the deflection address (which may have already received first order dynamic distortion correction) is applied to digital-to-analog converters 420 by digital deflection generator 200 in the usual manner. The same data is also applied to a look-up table or a computational means, such as a math co-processor, 430 to obtain correction values for gain and rotation as a function of the x and y addresses. If a math coprocessor is used, it is preferable to provide a pipelined processing architecture to effectively perform the computations in real time.

Both the correction values and the input address are applied to digital multipliers in order to evaluate the terms of the above polynomial equation. Deflection current values may be obtained by providing digital value conversion or digital-to-analog conversion at 440 or directly from digital-to-analog converters 420.

The resulting terms of the polynomial equation are then applied to a bank of digital-to-analog converters to obtain analog values of the x and y gain and rotation corrections. The rotation value is a multiplier having a value between zero and 1 to reduce the correction vector to a vector component parallel to one of the x and y coordinate defection directions. These values are suitably multiplied and input to the mixers 412 and 414. It is to be understood that the architecture of the implementation illustrated in FIG. 3, while preferred for allowing a maximum of the processing to be performed digitally, should be considered as being exemplary since other architectures for deriving correction values corresponding to the above polynomial equation will be apparent from the foregoing description to those skilled in the art.

In view of the foregoing, it is seen that the arrangement according to the invention provides a method and apparatus for correcting higher order errors in telecentricity introduced by variation from complementary action of deflection yokes 120 and 122. The invention also provides a technique of obtaining a large volume of correction data based on a small amount of empirical data, easily obtained during automated calibration of the e-beam tool.

It is to be understood that the present invention, while described in terms of high order errors in a telecentric projection/deflection system including a variable axis lens and magnetic deflection, the invention should not be considered as being limited thereto and, in fact, can be applied to other types of electron beam projection/deflection systems using either electric or magnetic deflection and to the correction of other types of errors encountered therein.

While the invention has been described in terms of a single preferred embodiment, those skilled in the art will recognize that the invention can be practiced with modification within the spirit and scope of the appended claims.

Having thus described my invention, what is claimed as new and desired to be secured by Letters Patent is as follows:

1. A method for correcting deviations from telecentric deflection in an electron beam projection/deflection system, comprising the steps of applying at least three deflection addresses to said electron beam deflection system, developing deflection currents corresponding to each of said at least three addresses, determining respective locations written corresponding to each of said at least three addresses, computing values of coefficients A, B, and C in the equation:

$$\Delta I_{x,y} = (I_x^2 + I_y^2)[Ax(I_y - I_x) - (I_x^2 + I_y^2)(BI_{x,y} + CI_{y,x})],$$

based on said addresses and currents, wherein $\Delta I_{x,y}$ is a correction current at address x, y and $I_x$ and $I_y$, $I_y$, $I_{x,y}$ and $I_{y,x}$ are current values corresponding to x and y addresses, determining correction values for deflection currents corresponding to a further address, corresponding to deflection currents at said further address and said values of A, B and C, and correcting said corresponding deflection currents by the amount of said correction current values.

2. A method for correcting deviations from telecentric deflection in an electron beam projection/deflection system, comprising the steps of establishing values for coefficients A, B and C in the equation:

$$\Delta I_{x,y} = (I_x^2 + I_y^2)[Ax(I_y - I_x) - (I_x^2 + I_y^2)(BI_{x,y} + CI_{y,x})],$$

wherein $\Delta I_{x,y}$ is a correction current at address x, y and $I_x$, $I_y$, $I_{x,y}$ and $I_{y,x}$ are current values corresponding to x and y addresses, determining correction values for deflection currents corresponding to an address and said values of A, B and C, and correcting said deflection currents by the amount of said correction current values.

3. An electron beam projection/deflection system including a deflection means for deflecting said electron beam in response to at least one deflection current applied thereto, a means for developing said at least one deflection current in response to an address, a means for providing correction values in response to said address, said correction values being approximately defined by a solution of the equation:

$$\Delta I_{x,y} = (I_x^2 + I_y^2)[Ax(I_y - I_x) - (I_x^2 + I_y^2)(BI_{x,y} + CI_{y,x})],$$

wherein $\Delta I_{x,y}$ is a correction current at address x, y and $I_x$, $I_y$, $I_{x,y}$ and $I_{y,x}$ are current values corresponding to x and y addresses, means for correcting said at least one deflection current in accordance with said correction value to derive a corrected deflection current, and means for applying said corrected deflection current to said deflection means.

4. An electron beam projection/deflection system as recited in claim 3, wherein said means for providing correction values includes a look-up table containing solutions to said equation for selected addresses.

5. An electron beam projection/deflection system as recited in claim 3, wherein said means for providing correction values includes a multiplier means including means for receiving inputs at least including values of A, B and C and an address.

6. An electron beam projection/deflection system as recited in claim 5, wherein said multiplier means is a digital multiplier.

7. An electron beam projection/deflection system as recited in claim 3, wherein said means for providing correction values includes a multiplier means including means for receiving inputs at least including values of solutions to said equations and at least one of an address and a value of said at least one deflection current.

8. An electron beam projection/deflection system as recited in claim 7, wherein said multiplier means is a digital multiplier.

9. An electron beam projection/deflection system as recited in claim 3, further including calibration means for determining values of A, B and C in said equation.

10. An electron beam projection/deflection system as recited in claim 9, wherein said means for providing correction values includes a look-up table containing solutions to said equation for selected addresses.

11. An electron beam projection/deflection system as recited in claim 9, wherein said means for providing correction values includes a multiplier means including means for receiving inputs at least including values of A, B and C and an address.

12. An electron beam projection/deflection system as recited in claim 11, wherein said multiplier means is a digital multiplier.

13. An electron beam projection/deflection system as recited in claim 9, wherein said means for providing correction values includes a multiplier means including means for receiving inputs at least including values of solutions to said equations and at least one of an address and a value of said at least one deflection current.

14. An electron beam projection/deflection system as recited in claim 13, wherein said multiplier means is a digital multiplier.

15. An electron beam projection/deflection system as recited in claim 3, wherein said means for providing correction values includes a math coprocessor means for providing solutions to said equation for selected addresses.

16. An electron beam projection/deflection system including a telecentric deflection means and a dynamic correction means for correcting deviations from telecentricity of greater than first order, said dynamic correction means including means responsive to an address, at least one deflection current corresponding to said address and not more than three coefficients of terms of a correction equation for providing a correction value, means for correcting said at least one deflection current in accordance with said correction value to obtain at least one corrected deflection current and means for applying said at least one corrected deflection current to said telecentric deflection means.

17. An electron beam projection/deflection system as recited in claim 16, wherein said correction equation is $$\Delta I_{x,y} = (I_x^2 + I_y^2)[Ax(I_y - I_x) - (I_x^2 + I_y^2)(BI_{x,y} + CI_{y,x})],$$

wherein $\Delta I_{x,y}$ is a correction current at address x, y and $I_x$, $I_y$, $I_{x,y}$ and $I_{y,x}$ are current values corresponding to x and y addresses.

* * * * *